United States Patent [19]
Sato et al.

[11] Patent Number: 5,383,153
[45] Date of Patent: Jan. 17, 1995

[54] SEMICONDUCTOR MEMORY DEVICE WITH FLASH-CLEAR FUNCTION

[75] Inventors: Hiroaki Sato; Hiroyuki Takahashi, both of Tokyo, Japan

[73] Assignee: NEC Corporation, Tokyo, Japan

[21] Appl. No.: 959,619

[22] Filed: Oct. 13, 1992

[30] Foreign Application Priority Data

Oct. 15, 1991 [JP] Japan ................... 3-295059

[51] Int. Cl.$^6$ .............................. G11C 11/40
[52] U.S. Cl. ....................... 365/155; 365/63; 365/179
[58] Field of Search ............ 365/155, 179, 900, 63

[56] References Cited

U.S. PATENT DOCUMENTS

| | | | |
|---|---|---|---|
| 3,634,833 | 1/1972 | Dunn et al. | 365/155 |
| 3,686,515 | 8/1972 | Kadono | 365/230.01 |
| 3,764,825 | 10/1973 | Stewart | 365/154 |
| 4,035,784 | 7/1977 | Brown | 365/155 |

FOREIGN PATENT DOCUMENTS 59-162693 9/1984 Japan ...................... 365/155

Primary Examiner—Joseph A. Popek
Assistant Examiner—F. Niranjan
Attorney, Agent, or Firm—Sughrue, Mion, Zinn, Macpeak & Seas

[57] ABSTRACT

A semiconductor memory device equipped with a flash-clear function has a plurality of flip-flop type memory cells each of which is formed by a first multi-emitter transistor and a second multi-emitter transistor, a clear line and a switching circuit. Each of the memory cells is connected between a word top line and a word bottom line. The second multi-emitter transistor has emitter nodes the number of which is smaller than that of emitter nodes of the first multi-emitter transistor. Some of the emitter nodes of the first multi-emitter transistor are connected to the clear line. Through the switching circuit, a current source is selectively connected to the word bottom line and the clear line. Since the first multi-emitter transistor is controlled by the clear line, the content of the same data can easily be written into a plurality of memory cells without such memory cells being caused to change their characteristics.

3 Claims, 3 Drawing Sheets

SEMICONDUCTOR MEMORY DEVICE WITH FLASH-CLEAR FUNCTION

BACKGROUND OF THE INVENTION (1) Field of the Invention

The present invention relates to a semiconductor memory device, and more particularly to a static type semiconductor memory device having a flash-clear function.

(2) Description of the Related Art

In a conventional static type semiconductor memory device, each memory cell is constituted by two inverters, and these memory cells are arranged in a matrix form so that reading or writing of data can be made to any one particular memory cell selected from the matrix. The semiconductor memory device constituting a cache memory is capable of simultaneously rewriting or renewing the data of a plurality of memory cells with the same data. Thus, the two inverters constituting each of the memory cells are constructed with inherent characteristic differences, meaning that each flip-flop can be easily brought to a predetermined state so that the writing of data to a plurality of memory cells can be performed simultaneously.

For example, in the conventional flip-flop shown in FIG. 1, the resistance values of the resistors R1 and R2 are set for R1>R2, so that the transistor Q1 of the two transistors constituting the flip-flop may easily turn ON. Thus, when the data holding function of the memory cells is reactivated after having been temporarily stopped, the data in the plurality of memory cells can be simultaneously rewritten or renewed with the same data.

However, there has been a problem with the kind of conventional semiconductor memory device described above that, since the characteristics of the memory cells tend to lean to one particular state of the two, differences are caused to occur in the writing-in characteristics in the normal use of the device or differences are caused to occur in data holding characteristics. This is a problem with the conventional semiconductor memory devices which is to be solved by the present invention.

SUMMARY OF THE INVENTION

It is, therefore, an object of the invention to overcome the problem existing in conventional semiconductor memory devices, and to provide an improved semiconductor memory device in which the same data can be easily written in a plurality of the memory cells simultaneously while the device has a lower power consumption.

According to one aspect of the invention, there is provided a semiconductor memory device equipped with a flash-clear function and having a plurality of flip-flop type memory cells each connected between a word top line and a word bottom line, the device comprising:

a first multi-emitter transistor;

a second multi-emitter transistor having emitter nodes the number of which is smaller than that of emitter nodes of the first multi-emitter transistor, the first multi-emitter transistor and the second multi-emitter transistor constituting each of the memory cells;

a clear line to which some of the emitter nodes of the first multi-emitter transistor are connected; and a switching circuit through which a current source is selectively connected to the word bottom line and the clear line.

When the current source is connected to the word bottom line through the switching circuit, the circuit performs the normal memory operation and, on the other hand, when the current source is connected to the clear line through the switching circuit, the first multi-emitter transistors of the plurality of memory cells turn ON and the memory cells are simultaneously set to a predetermined state.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, some preferred embodiments of the present invention will be explained with reference to the accompanying drawings. It is to be noted that, throughout the following explanation, similar symbols and numerals refer to the same or similar elements in all the figures of the drawings.

Figure 1:
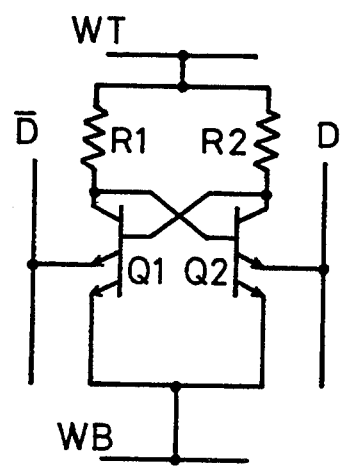
FIG. 1 is a circuit diagram showing a conventional memory cell.
Figure 2:
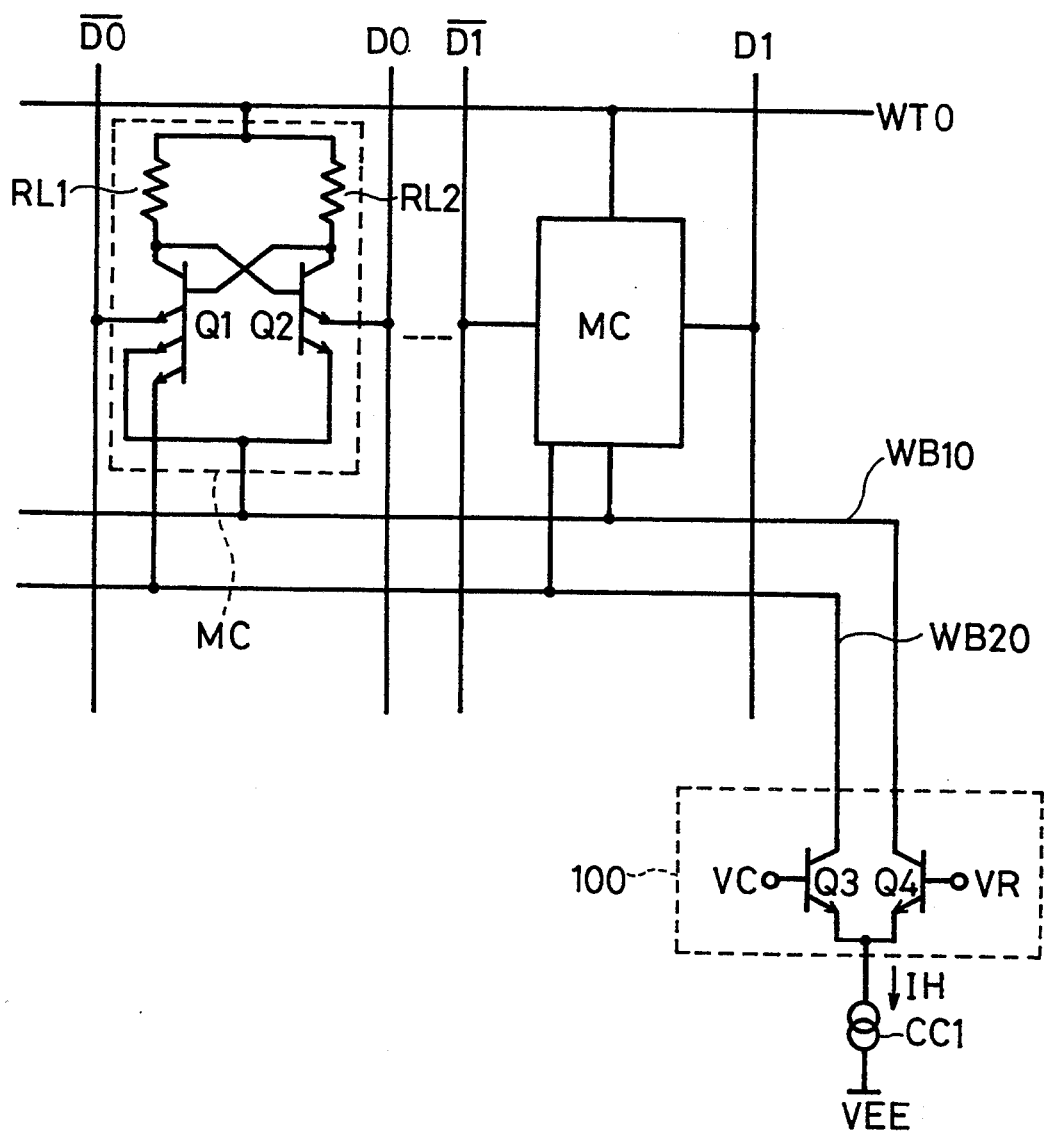
FIG. 2 is a circuit diagram showing a static type semiconductor memory device of a first embodiment according to the invention.

FIG. 2 shows in a circuit diagram a semiconductor memory device of a first embodiment according to the invention, in which an emitter-coupled memory cell MC is constituted by a triple-emitter transistor Q1, a double-emitter transistor Q2 and load resistors RL1, RL2 with these load resistors being connected to the collector of each of the transistors Q1 and Q2, respectively. A plurality of memory cells MCs, each of which has the above explained circuit configuration, are commonly connected to a word top line WT0, a word bottom line WB10 for allowing a hold current to flow, and a clear line WB20 for allowing a current to flow when the data to a plurality of memory cells is written simultaneously (hereinafter referred to as "clear state"). A constant-current source CC1 which serves as a hold current source is selectively connected to the word bottom line WB10 and the clear line WB20 through a switching circuit 100. The switching circuit 100 is formed by two bipolar transistors Q3 and Q4. The transistor Q3 has a collector connected to the clear line WB20 and a base receiving a control voltage VC, While the transistor Q4 has a collector connected to the word bottom line WB10 and a base receiving a reference voltage VR. The emitters of the two transistors Q3 and Q4 are connected together and coupled to an emitter power supply terminal VEE through the constant-current source CC1.

The control voltage VC is a signal which is externally applied and, under a normal operating state, the level of that signal is set lower than that of the reference voltage VR so that the transistor Q4 turns ON and the hold current (IH) flows through the transistor Q4. On the other hand, under the clear state, the control voltage VC is set to a level higher than the reference voltage VR so that the transistor Q3 is in a conductive state. Under such state, since the current must flow from the triple-emitter transistor Q1 of the two transistors Q1 and Q2 constituting the memory cell and thus the transistor Q1 becomes ON, the triple-emitter transistors Q1 of all the memory cells MCs turn ON so that the data are rewritten in all the memory cells MCs simultaneously.

However, if the current path for the hold current is merely switched from the transistor Q4 to the transistor Q3, the time for writing-in may possibly be prolonged.

Figure 3:
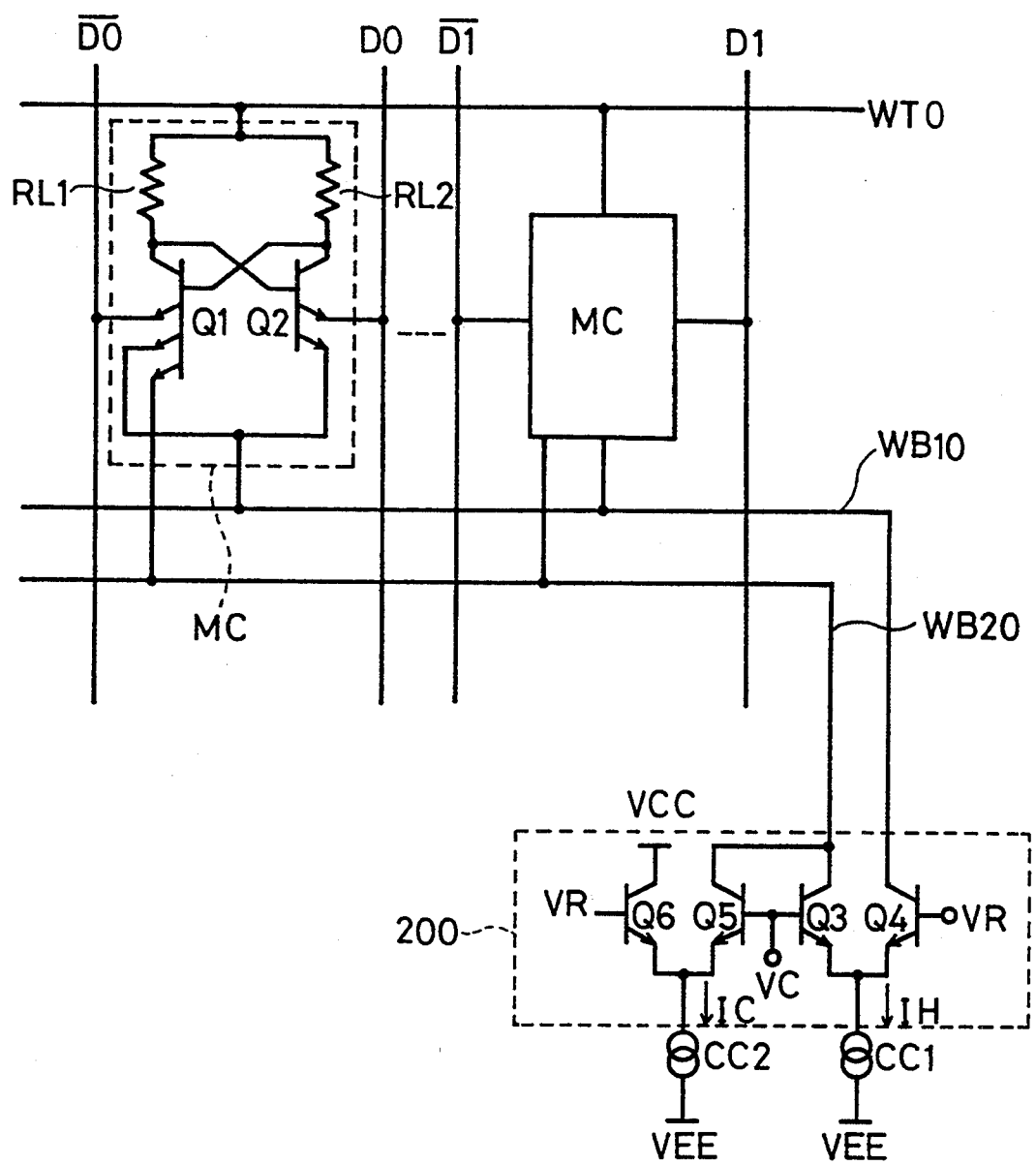
FIG. 3 is a circuit diagram showing a static type semiconductor memory device of a second embodiment according to the invention.

FIG. 3 is a circuit diagram showing a semiconductor memory device of a second embodiment of the invention, in which the time for rewriting is shortened. A switching circuit 200 has two bipolar transistors Q5 and Q6 in addition to the switching circuit 100 of the first embodiment shown in FIG. 2. More specifically, the transistor Q5 has a collector connected to the clear line WB20 and a base receiving the control voltage VC, and the transistor Q6 has a collector connected to a collector power supply terminal VCC. The emitters of the transistors Q5 and Q6 are connected together and coupled through a constant-current source CC2 to the emitter power supply terminal VEE. In this arrangement, the constant-current source CC2 is connected to the switching circuit 200 as a second constant-current source in addition to the first constant-current source CC1, so that the total current (IH+IC) flows to the transistors Q3 and Q5 under the clear state and, thus, the time required for rewriting is shortened.

Figure 4:
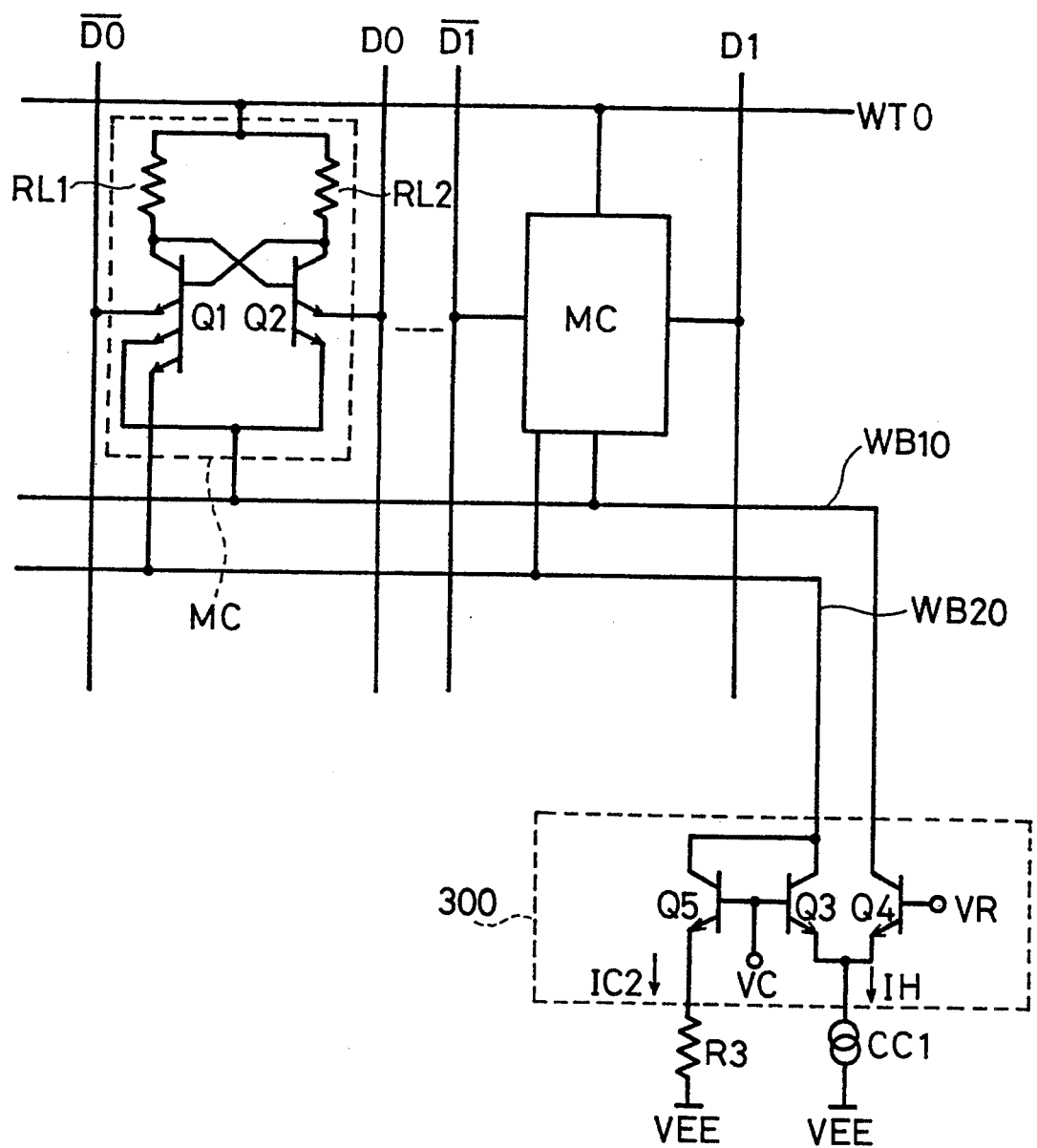
FIG. 4 is a circuit diagram showing a static type semiconductor memory device of a third embodiment according to the invention.

FIG. 4 is a circuit diagram showing a semiconductor memory device of a third embodiment of the invention, in which the switching circuit is improved thereby removing a defect of allowing a constant or steady-state flow of the current IC in the switching circuit 200 of the second embodiment. In this embodiment, the transistor Q6 in the second embodiment is not required and the constant-current source CC2 in the second embodiment is replaced by a resistor R3. The low level of the control voltage VC which is applied to the bases of the transistors Q3 and Q5 is set lower than the VEE level of the same transistors Q3 and Q5 by about 0.7 V, and the high level thereof is set higher than the level of the reference voltage VR which is applied to the base of the transistor Q4. Then, normally, the transistors Q5 and Q3 are in their OFF-state while only the transistor Q4 is in its ON-state, thereby allowing only the hold current (IH) to flow in the memory cells (MCs).

Under the clear state, the transistors Q5 and Q3 turn ON simultaneously and the total current (IH+IC2) flows from the transistor Q1 in each of the memory cells to the switching circuit 300, whereby the triple-emitter transistor Q1 in each of the memory cells becomes ON and thus the same data is rewritten simultaneously. The current IC2 is dependent on the level of the control voltage VC and the flow of current increases as the level becomes higher. This relation is $IC2 = (-VC - Vf)/R3$ in which Vf represents a forward voltage of a p-n junction diode. However, since the current IC2 flows only for a short period of time under the clear state, the average power consumption does not increase largely.

As explained above, according to the present invention, since the first multi-emitter transistor is controlled by the clear line, the same data can easily be written into a plurality of memory cells without such memory cells being caused to change their characteristics.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device equipped with a flash-clear function and having a plurality of flip-flop type memory cells each connected between a word top line and a word bottom line, said device comprising:

a first multi-emitter transistor;

a second multi-emitter transistor having emitter nodes the number of which is smaller than that of emitter nodes of said first multi-emitter transistor, said first multi-emitter transistor and said second multi-emitter transistor constituting each of said memory cells;

a clear line to which one of said emitter nodes of said first multi-emitter transistor is connected; and a switching circuit through which a current source is selectively connected to said word bottom line and said clear line, said switching circuit comprising:

a third transistor of a bipolar type, having a base node receiving a reference voltage and connected between said word bottom line and a single constant-current source; and a fourth transistor of a bipolar type, having a base node receiving a control voltage and connected between said clear line and said single constant-current source.

2. A semiconductor memory device equipped with a flash-clear function and having a plurality of flip-flop type memory cells each connected between a word top line and a word bottom line, said device comprising:

a first multi-emitter transistor;

a second multi-emitter transistor having emitter nodes the number of which is smaller than that of emitter nodes of said first multi-emitter transistor, said first multi-emitter transistor and said second multi-emitter transistor constituting each of said memory cells;

a clear line to which one of said emitter nodes of said first multi-emitter transistor is connected; and a switching circuit through which a current source is selectively connected to said word bottom line and said clear line, said switching circuit comprising:

a third transistor of a bipolar type, having a base node receiving a reference voltage and connected between said word bottom line and a first constant-current source;

a fourth transistor of a bipolar type, having a base node receiving a control voltage and connected between said clear line and said first constant-current source;

a fifth transistor of a bipolar type, having a base node receiving said control voltage and connected between said clear line and a second constant current source; and a sixth transistor of a bipolar type, having a base node receiving the reference voltage and connected between a collector power supply terminal and said second constant-current source.

3. A semiconductor memory device equipped with a flash-clear function and having a plurality of flip-flop type memory cells each connected between a word top line and a word bottom line, said device comprising:
- a first multi-emitter transistor;
- a second multi-emitter transistor having emitter nodes the number of which is smaller than that of emitter nodes of said first multi-emitter transistor, said first multi-emitter transistor and said second multi-emitter transistor constituting each of said memory cells;
- a clear line to which one of said emitter nodes of said first multi-emitter transistor is connected; and
- a switching circuit through which a current source is selectively connected to said word bottom line and said clear line, said switching circuit comprising:
- a third transistor of a bipolar type, having a base node receiving a reference voltage and connected between said word bottom line and a single constant-current source;
- a fourth transistor of a bipolar type, having a base node receiving a control voltage and connected between said clear line and said single constant-current source; and
- a fifth transistor of a bipolar type, having a base node receiving said control voltage and connected between said clear line and an emitter power supply terminal through a resistor, said control voltage being set such that an inactive level of the control voltage causes both said fourth transistor and said fifth transistor to be turned OFF, and an active level of the control voltage causes said fourth and fifth transistors to be turned ON.

* * * * *